(12) United States Patent
Kalkanoglu et al.

(10) Patent No.: US 8,410,349 B2
(45) Date of Patent: Apr. 2, 2013

(54) PHOTOVOLTAIC ROOFING WIRING ARRAY, PHOTOVOLTAIC ROOFING WIRING SYSTEMS AND ROOFS USING THEM

(75) Inventors: Husnu M. Kalkanoglu, Swarthmore, PA (US); Gregory F. Jacobs, Oreland, PA (US); Wayne E. Shaw, Glen Mills, PA (US)

(73) Assignee: CertainTeed Corporation, Valley Forge, PA (US)

( * ) Notice: Subject to any disclaimer, the term of this patent is extended or adjusted under 35 U.S.C. 154(b) by 0 days.

(21) Appl. No.: 13/465,312

(22) Filed: May 7, 2012

(65) Prior Publication Data

US 2012/0216467 A1  Aug. 30, 2012

Related U.S. Application Data

(60) Continuation of application No. 12/869,598, filed on Aug. 26, 2010, now Pat. No. 8,173,889, which is a division of application No. 11/743,073, filed on May 1, 2007, now abandoned.

(51) Int. Cl.
*H01L 31/042* (2006.01)
*E04D 13/18* (2006.01)

(52) U.S. Cl. ..................... 136/244; 52/173.3
(58) Field of Classification Search .......... 136/243–265; 52/173.3
See application file for complete search history.

(56) References Cited

U.S. PATENT DOCUMENTS

| | | | |
|---|---|---|---|
| 4,040,867 A | 8/1977 | Forestieri et al. |
| 4,321,416 A | 3/1982 | Tennant et al. |
| 4,574,160 A | 3/1986 | Cull et al. |
| 4,617,420 A | 10/1986 | Dilts et al. |
| 4,860,509 A | 8/1989 | Laaly et al. |
| 4,936,063 A | 6/1990 | Humphrey |
| 5,125,983 A | 6/1992 | Cummings |
| 5,590,495 A | 1/1997 | Bressler et al. |
| 5,830,779 A | 11/1998 | Bressler et al. |
| 5,990,414 A | 11/1999 | Posnansky |
| 6,065,255 A | 5/2000 | Stem et al. |
| 6,093,884 A | 7/2000 | Toyomura et al. |
| 6,155,006 A | 12/2000 | Mimura et al. |
| 6,245,987 B1 | 6/2001 | Shiomi et al. |
| 6,268,559 B1 | 7/2001 | Yamawaki |

(Continued)

FOREIGN PATENT DOCUMENTS

| | | |
|---|---|---|
| EP | 1201842 | 6/2000 |
| JP | 2001-332752 | 11/2001 |

(Continued)

OTHER PUBLICATIONS

English language abstract and machine translation of JP 05-230960.

(Continued)

*Primary Examiner* — Kevin P Kerns
*Assistant Examiner* — Kevin E Yoon
(74) *Attorney, Agent, or Firm* — McDonnell Boehnen Hulbert & Berghoff LLP

(57) ABSTRACT

Photovoltaic wiring arrays and photovoltaic wiring systems suitable for use in rooftop photovoltaic power generation systems are provided. Accordingly, one aspect of the invention provides a photovoltaic roofing wiring array for use with a plurality of photovoltaic roofing elements, the photovoltaic roofing wiring system including: a positive parallel wiring run comprising a main line and one or more connection branches pendant from the main line, each connection branch being terminated in a positive connector; and a negative parallel wiring run comprising a main line and one or more connection branches pendant from the main line, each connection branch being terminated in a negative connector. In some embodiments of the invention, the photovoltaic roofing wiring arrays are substantially prefabricated.

20 Claims, 7 Drawing Sheets

U.S. PATENT DOCUMENTS

| | | |
|---|---|---|
| 6,311,436 B1 | 11/2001 | Mimura et al. |
| 6,331,671 B1 | 12/2001 | Makita et al. |
| 6,336,304 B1 | 1/2002 | Minura et al. |
| 6,465,724 B1 | 10/2002 | Garvison et al. |
| 6,521,821 B2 | 2/2003 | Makita et al. |
| 6,649,822 B2 | 11/2003 | Eguchi et al. |
| 6,800,801 B2 * | 10/2004 | Sasaoka et al. ............... 136/246 |
| 6,840,799 B2 | 1/2005 | Yoshikawa et al. |
| 6,875,914 B2 | 4/2005 | Guha et al. |
| 7,445,488 B2 | 11/2008 | Feldmeier et al. |
| 2001/0050102 A1 | 12/2001 | Matsumi et al. |
| 2002/0043031 A1 | 4/2002 | Eguchi et al. |
| 2004/0000334 A1 | 1/2004 | Ressler |
| 2005/0061360 A1 | 3/2005 | Horioka et al. |
| 2005/0178430 A1 | 8/2005 | McCaskill et al. |
| 2005/0257453 A1 | 11/2005 | Cinnamon |
| 2006/0243318 A1 | 11/2006 | Feldmeier et al. |
| 2009/0014051 A1 | 1/2009 | Gumm |

FOREIGN PATENT DOCUMENTS

| | | |
|---|---|---|
| JP | 2002-124694 | 4/2002 |
| JP | 2003-124489 | 3/2003 |
| JP | 2004-014851 | 8/2010 |
| WO | 9216972 | 10/1992 |
| WO | 2004066324 | 8/2004 |
| WO | 2007035677 | 3/2007 |

OTHER PUBLICATIONS

English language abstract and machine translation of JP 05-202239.
Sunslates installation manual, Atlantis Energy Systems, Jun. 10, 2002.
SOLARLOK Interconnection System Catalog, Tyco Electronic, No. 889753-2, Revised Jun. 2005.
Multi-Contact Connector system for photovoltaic catalog, Multi-Contact AG, Feb. 2007.
JPO machine translation of JP 2004014851A.

* cited by examiner

PHOTOVOLTAIC ROOFING WIRING ARRAY, PHOTOVOLTAIC ROOFING WIRING SYSTEMS AND ROOFS USING THEM

CROSS-REFERENCE TO RELATED APPLICATIONS

This application is a continuation of U.S. patent application Ser. No. 12/869,598, which in turn is a divisional of U.S. patent application Ser. No. 11/743,073, each of which is hereby incorporated by reference in its entirety. The benefit of priority to both applications pursuant to 35 U.S.C. §120 is hereby claimed.

BACKGROUND OF THE INVENTION

1. Field of the Invention

The present invention relates generally to photovoltaic roofing systems. The present invention relates more particularly to photovoltaic roof arrays and wiring systems for use therewith.

2. Technical Background

The search for alternative sources of energy has been motivated by at least two factors. First, fossil fuels have become more and more expensive due to increasing scarcity and unrest in areas rich in petroleum deposits. Second, there exists overwhelming concern about the effects of the combustion of fossil fuels on the environment, due to factors such as air pollution (from $NO_x$, hydrocarbons and ozone) and global warming (from $CO_2$). In recent years, research and development attention has focused on harvesting energy from natural environmental sources such as wind, flowing water and the sun. Of the three, the sun appears to be the most widely useful energy source across the continental United States; most locales get enough sunshine to make solar energy feasible.

There are now available components that convert light energy into electrical energy. Such "photovoltaic cells" are often made from semiconductor-type materials such as doped silicon in either single crystalline, polycrystalline, or amorphous form. The use of photovoltaic cells on roofs is becoming increasingly common, especially as device performance has improved. They can be used, for example, to provide at least a fraction of the electrical energy needed for a building's overall function, or can be used to power one or more particular devices, such as exterior lighting systems.

Photovoltaic roofing elements can be used to provide weather protection, like standard roofing elements, as well as photovoltaic power generation. Many such photovoltaic roofing elements take the form of a standard roofing element, such as a shingle or a tile, with one or more photovoltaic cells disposed thereon or integrated therewith. Photovoltaic roofing elements are generally difficult to install, as they must not only be physically connected to the roof in a manner that provides weather protection but also be electrically interconnected into a wiring system to be connected to the elements of a larger photovoltaic generation system (e.g., inverters, batteries and meters). Such installation often requires an electrical specialist to perform the electrical interconnections, which can be difficult to time appropriately with the physical installation of the photovoltaic roofing elements. Moreover, relatively large voltage differences (e.g., 100-600 V) are created in many photovoltaic roofing systems. As such, it is desirable to protect the electrical interconnections from the weather so as to avoid arcing and short circuits.

Accordingly, there remains a need for photovoltaic roofing systems having ease of both physical and electrical installability and in which electrical interconnections are protected from the weather.

SUMMARY OF THE INVENTION

One aspect of the invention is a photovoltaic roofing wiring array for use with a plurality of photovoltaic roofing elements, each photovoltaic roofing element having a positive lead terminated in a positive connector and a negative lead terminated in a negative connector, and a lead-to-lead distance between the positive connector and the negative connector, the photovoltaic roofing wiring array comprising a positive parallel wiring run, the positive parallel wiring run comprising a main line and one or more connection branches pendant from the main line, each connection branch being terminated in a positive connector; and a negative parallel wiring run, the negative parallel wiring run comprising a main line and one or more connection branches pendant from the main line, each connection branch being terminated in a negative connector, wherein each positive connector is coupleable to the positive connectors of the photovoltaic roofing elements; and wherein each negative connector is coupleable to the negative connectors of the photovoltaic roofing elements.

Another aspect of the present invention is a photovoltaic roofing wiring array as described above, further comprising one or more series wiring runs, each series wiring run comprising a sequence of one or more wiring elements, each wiring element having a positive end terminated in a positive connector coupleable to the positive connector of the photovoltaic roofing elements, and a negative end terminated in a negative connector coupleable to the negative connector of the photovoltaic roofing elements, the sequence being disposed sequentially in a substantially head-to-tail fashion from a positive connector of the positive parallel wiring run to a negative connector of the negative parallel wiring run, wherein the negative connector of a first wiring element in the sequence is disposed within one lead-to-lead distance of the positive connector of the positive parallel wiring run; the positive connector of a last wiring element in the sequence is disposed within one lead-to-lead distance of the negative connector of the negative parallel wiring run; and for any other wiring elements in the sequence, the positive connector is within one lead-to-lead distance of the negative connector of the subsequent wiring element; and the negative connector is within one lead-to-lead distance of the positive connector of the previous wiring element.

Another aspect of the present invention is a roof comprising a roof deck and a photovoltaic roofing wiring array as described above disposed on the roof deck.

Another aspect of the invention is a photovoltaic roofing wiring system comprising a wiring substrate and a wiring array as described above disposed on or within the wiring substrate.

Another aspect of the invention is a roof comprising a photovoltaic roofing wiring system as described above disposed on a roof deck.

Another aspect of the invention is a roof comprising:
a roof frame;
a wiring substrate disposed on the roof deck;
a wiring array disposed on or within the wiring substrate, the wiring array comprising
a positive parallel wiring run, the positive parallel wiring run comprising a main line and one or more connection branches pendant from the main line, each connection branch being terminated in a positive connector;

a negative parallel wiring run, the negative parallel wiring run comprising a main line and one or more connection branches pendant from the main line, each connection branch being terminated in a negative connector;

one or more series wiring runs, each series wiring run comprising a first end wiring element having a positive end terminated in a positive connector and a negative end terminated in a negative connector; a second end wiring element having a positive end terminated in a positive connector and a negative end terminated in a negative connector; and a sequence of one or more interior wiring elements, each having a positive end terminated in a positive connector and a negative end terminated in a negative connector, arranged in a substantially head-to-tail manner from the first end wiring element to the second end wiring element;

one or more first end photovoltaic roofing elements, each first end photovoltaic roofing element comprising a roofing substrate, a photovoltaic element disposed on or within the roofing substrate, the photovoltaic element having a positive lead terminated in a positive connector, the positive connector being coupled to a positive connector of a connection branch of the positive parallel wiring run; and a negative lead terminated in a negative connector, the negative connector being coupled to the negative connector of the first end wiring element of the series wiring run corresponding to the positive connector of the connection branch; and one or more second end photovoltaic roofing elements, each second end photovoltaic roofing element comprising a roofing substrate; and a photovoltaic element disposed on or within the roofing substrate, the photovoltaic element having a negative lead terminated in a negative connector, the negative connector being coupled to a negative connector of a connection branch of the negative parallel wiring run; and a positive lead terminated in a positive connector, the positive connector being coupled to the positive connector of the second end wiring element corresponding to the negative connector of the connection branch.

Another aspect of the invention is a roof as described above, further including one or more interior photovoltaic roofing elements, each interior photovoltaic roofing element comprising a roofing substrate; and a photovoltaic element disposed on or within the roofing substrate, the photovoltaic element having a positive lead terminated in a positive connector, the positive connector being coupled to a positive connector of the first end wiring element or an interior wiring element; and a negative lead terminated in a negative connector, the negative connector being coupled to the negative connector corresponding to the positive connector.

The present invention results in a number of advantages over the prior art. For example, the photovoltaic roofing wiring systems of the present invention can be installed by an installer who is relatively unskilled in the field of electrical interconnection. Moreover, the photovoltaic roofing wiring systems of the present invention can be constructed from individual modular parts, allowing the skilled artisan flexibility in accommodating any roof size or shape, and any size or shape of photovoltaic elements. Additional features and advantages of the invention will be set forth in the detailed description which follows and in part will be readily apparent to those skilled in the art from the description or recognized by practicing the invention as described in the written description and claims hereof, as well as in the appended drawings.

It is to be understood that both the foregoing general description and the following detailed description are merely exemplary of the invention, and are intended to provide an overview or framework for understanding the nature and character of the invention as it is claimed.

The accompanying drawings are included to provide a further understanding of the invention and are incorporated in and constitute a part of this specification. The drawings are not necessarily to scale, and sizes of various elements can be distorted for clarity. The drawings illustrate one or more embodiment(s) of the invention, and together with the description serve to explain the principles and operation of the invention.

DETAILED DESCRIPTION OF THE INVENTION

Figure 1:
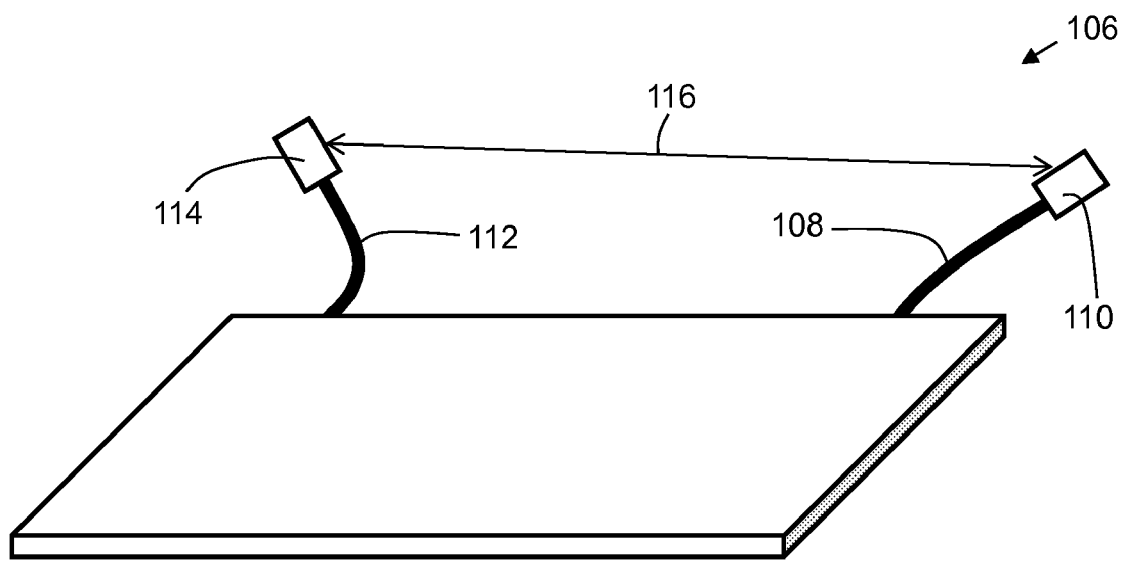
FIG. 1 is a top perspective view of a photovoltaic element suitable for use with the photovoltaic roofing wiring arrays of the present invention.

One aspect of the invention comprises a photovoltaic roofing wiring array configured for use with a photovoltaic element, an example of which is shown in top perspective view in FIG. 1. Photovoltaic element 106 includes a positive lead 108 terminated in a positive connector 110, and a negative lead 112 terminated in a negative connector 114. As shown in FIG. 1, the positive and negative leads may extend from the photovoltaic element. Alternatively, as the skilled artisan would appreciate, they can be integrally formed with the rest of the photovoltaic element, with the connectors mounted directly on the surface of the element. The lead-to-lead distance 116 is the distance spanning the connectorized ends of the leads of a single photovoltaic element. If one or both leads are flexible, the lead-to-lead distance is a range of distances, with a lower limit being the distance between the connectorized ends when they are brought together in closest proximity and an upper limit being the distance between the connectorized ends when they are separated as far apart as possible. The limits of the range (both lower and upper) depend upon the length of the leads, the distance between the points at which the leads attached to the photovoltaic element, and the flexibility of the leads. Examples of photovoltaic elements that can be adapted by the skilled artisan for use with the present invention include those available from China Electric Equipment Group of Nanjing, China, as well as from several domestic suppliers such as Uni-Solar, Sharp, Shell Solar, BP Solar, USFC, FirstSolar, General Electric, Schott Solar, Evergreen Solar and Global Solar.

One example of a desirable photovoltaic element for use with the present invention is a photovoltaic roofing element. In the embodiment shown in top perspective view in FIG. 2, photovoltaic roofing element 202 includes a roofing substrate 204, and a photovoltaic element 206 disposed on or integrated with the roofing substrate 204. The photovoltaic element has a positive lead 208 terminated in a positive connector 210, and a negative lead 212 terminated in a negative connector 214. The lead-to-lead distance 216 is the distance spanning the connectorized ends of the leads of a single photovoltaic roofing element. As the skilled artisan will appreciate, the roofing substrate may take many forms, including a shingle, a tile, a shake or a panel. For example, in certain embodiments of the invention the roofing substrate is an asphalt shingle. Examples of photovoltaic roofing elements which can be adapted by the skilled artisan for use with the present invention include those described in U.S. Pat. Nos. 4,040,867, 5,437,735, 5,590,495, 5,990,414, 6,155,006 and 6,311,436; U.S. Patent Application Publication nos. 2004/0000334, 2005/0178428 and 2006/0266406; U.S. patent application Ser. Nos. 11/412,160 and 11/456,200; and the U.S. patent application Ser. No. 11/742,909 entitled "PHOTOVOLTAIC DEVICES AND PHOTOVOLTAIC ROOFING ELEMENTS INCLUDING GRANULES, AND ROOFS USING THEM," filed on May 1, 2007, each of which is hereby incorporated herein by reference.

As the skilled artisan will appreciate, the photovoltaic elements and photovoltaic roofing elements used in the present invention can include a bypass diode that connects the positive lead and the negative lead. The bypass diode allows current to flow between the positive lead and the negative lead when a fault, a loss of illumination or a malfunction occurs in the photovoltaic cell(s) of the photovoltaic element or photovoltaic roofing element. The bypass diode serves to cut a photovoltaic element or photovoltaic roofing element out of the photovoltaic power generation system when it malfunctions.

Figure 2:
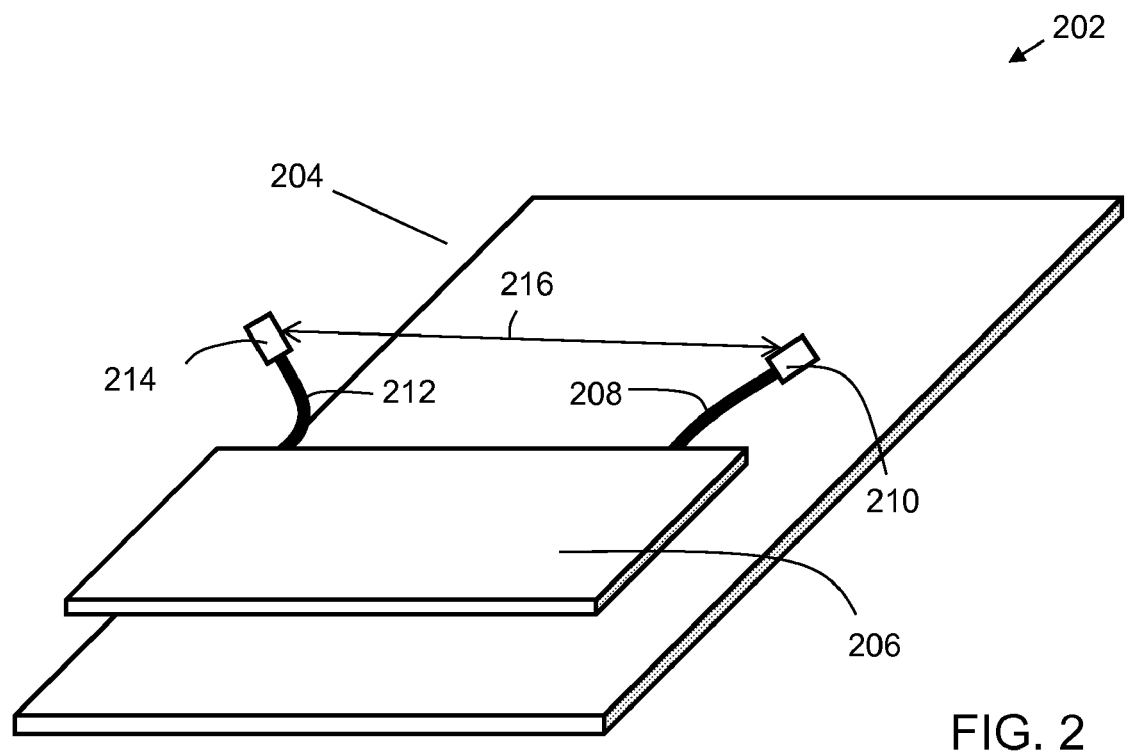
FIG. 2 is a top perspective view of a photovoltaic roofing element suitable for use with the photovoltaic roofing wiring arrays of the present invention.

In the embodiments shown in FIGS. 1 and 2, the positive leads and the negative leads include wires or cables that extend from the bulk of the photovoltaic element or photovoltaic roofing element. However, as the skilled artisan will recognize, the photovoltaic elements and photovoltaic roofing elements used in practicing the present branches need not have actual wires or cables as the positive and negative leads. Rather, the positive leads and negative leads can be integral to the photovoltaic element or photovoltaic roofing element, with the positive connector and negative connector being mounted directly on the surface of the photovoltaic element or photovoltaic roofing element.

In certain embodiments of the invention, the photovoltaic roofing element has a channel or void space formed on its underside adapted to fit the wires and/or connectors of the photovoltaic roofing wiring systems of the present invention. For example, when the photovoltaic roofing element is an asphalt shingle, additional layers of asphalt-coated web material can be applied to the back side of the shingle in certain areas, leaving the back side of the shingle with a desired channel or void space. Molding techniques may also be used to create the desired channel or void space. As the skilled artisan would appreciate, when such a photovoltaic roofing element is installed it can be disposed, for example, so that the channel accepts part of the photovoltaic wiring array, leads and connectors connecting a previously-laid photovoltaic roofing element to the photovoltaic wiring array. Such channels or voids enable hiding the wiring array or portions thereof from view when the photovoltaic roofing wiring system is installed.

Figure 3:
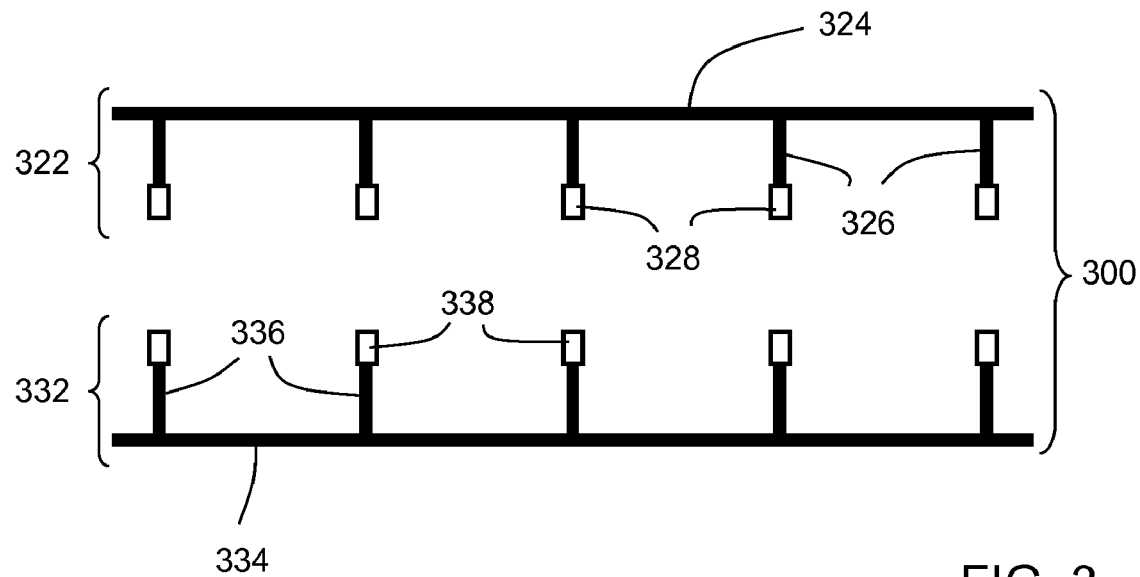
FIG. 3 is a top view of a photovoltaic roofing wiring array according to one embodiment of the present invention.

One embodiment of the invention is shown in schematic view in FIG. 3. Photovoltaic roofing wiring array 300 includes a positive parallel wiring run 322 and a negative parallel wiring run 332. These two parallel wiring runs form the backbone of the photovoltaic roofing wiring array, and in use are usually connected to the power handling hardware of a photovoltaic power generation system. They may, for example, be respectively connected to the positive and negative terminals of an inverter, as would be appreciated by the skilled artisan. Each of the positive parallel wiring run 322 and the negative parallel wiring run 332 includes a main line (324 and 334, respectively) and one or more connection branches (326 and 336, respectively) pendant from the main line. Each connection branch is terminated in a connector; on the positive parallel wiring run 322, the connection branches 326 are terminated in positive connectors 328, while on the negative parallel wiring run 332, the connection branches 336 are terminated in negative connectors 338. As the skilled artisan will appreciate, the connection branches need not include lengths of wiring pendant from the main line as shown in FIG. 3. Rather, the connection branch may simply be a connector connected in parallel on the main line itself.

The positive connectors of the positive parallel wiring run are coupleable with the positive connectors of the photovoltaic roofing elements to be used with the photovoltaic roofing wiring array. Similarly, the negative connectors of the negative parallel wiring run are coupleable with the negative connectors of the photovoltaic roofing elements. As used herein, when connectors are "coupleable" they can be connected so as to form an electrically-conductive connection between them. As the skilled artisan will appreciate, many types of electrical connectors are suitable for use in the present invention. In certain desirable embodiments of the invention, the connectors are quick-disconnect connectors.

Figure 4:
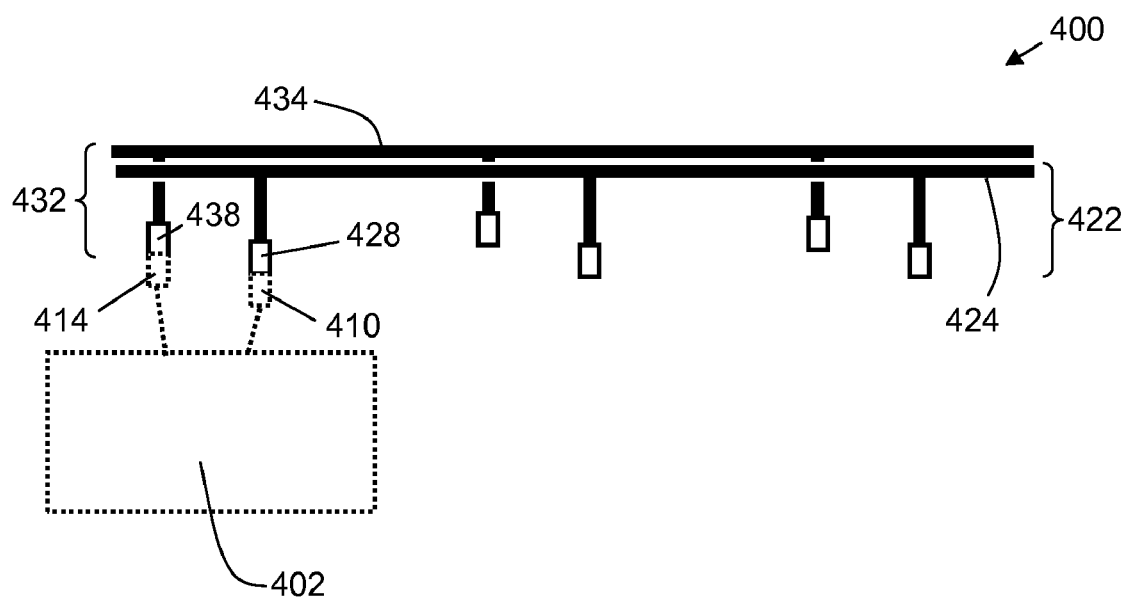
FIG. 4 is a top view of a photovoltaic roofing wiring array in which the main lines of the parallel wiring runs run along a common path, according to one embodiment of the present invention.

FIG. 4 is a schematic view of a photovoltaic roofing wiring array 400 according to another embodiment of the invention. Instead of being disposed apart as shown in FIG. 3, the main lines 424 and 434 run along a common path. In certain embodiments of the invention, the main lines 424 and 434 are physically connected (though electrically isolated from one another), either as two individual cables affixed to one another (e.g. as a bundle of cables), or as a pair of individual conductors within a single cable. When the main lines 424 and 434 run along a common path, and especially when they are affixed to one another or formed in a single cable, they can be more easily routed and installed.

In the embodiments of FIGS. 3 and 4, there are no series wiring runs disposed between a positive connector of the parallel wiring run and its corresponding negative connector. In these embodiments of the invention, each positive connector is within one lead-to-lead distance of its corresponding negative connector, so that a photovoltaic element can be connected between them. For example, in FIG. 4, photovoltaic element 402 has a positive lead terminated in a positive connector, and a negative lead terminated in a negative connector. The positive connector 410 of photovoltaic element 402 is connected with one positive connector 428 of the positive parallel wiring run 422, and the negative connector 414 of photovoltaic element 402 is connected with the corresponding negative connector 432 of the negative parallel wiring run 438. In this way, photovoltaic elements can be electrically connected to the wiring array to form part of a parallel-configured photovoltaic power generation system.

The parallel wiring runs can be configured in any desired arrangement. For example, the parallel wiring runs may run in a zig-zag fashion or a switchback fashion, so as to interconnect multiple courses of photovoltaic elements.

Figure 5:
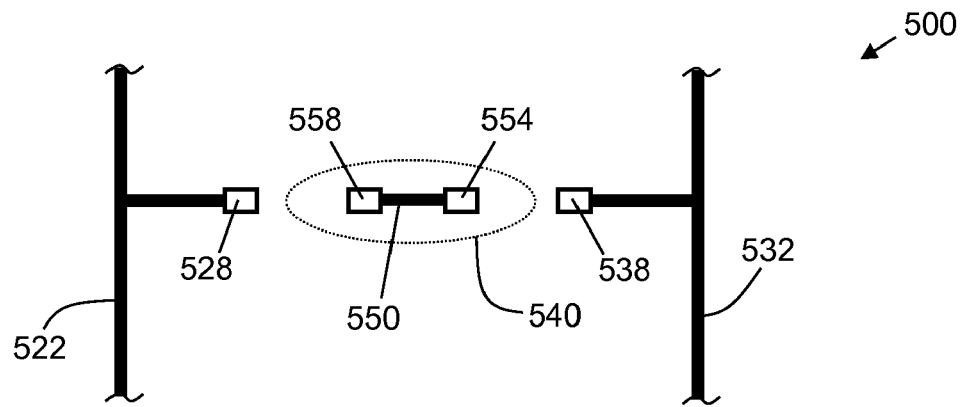
FIG. 5 is a top view of a photovoltaic roofing wiring array including one wiring element in a series wiring run, according to one embodiment of the present invention.
Figure 6:
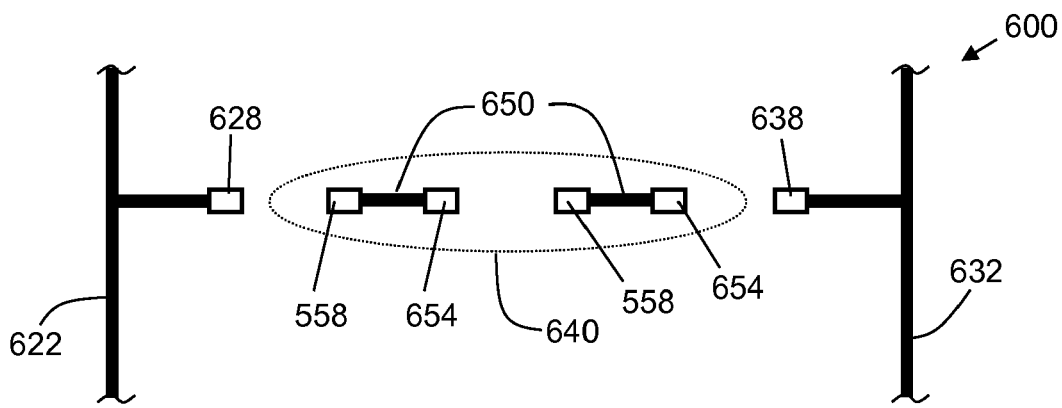
FIG. 6 is a top view of a photovoltaic roofing wiring array including two wiring elements in a series wiring run, according to one embodiment of the present invention.
Figure 7:
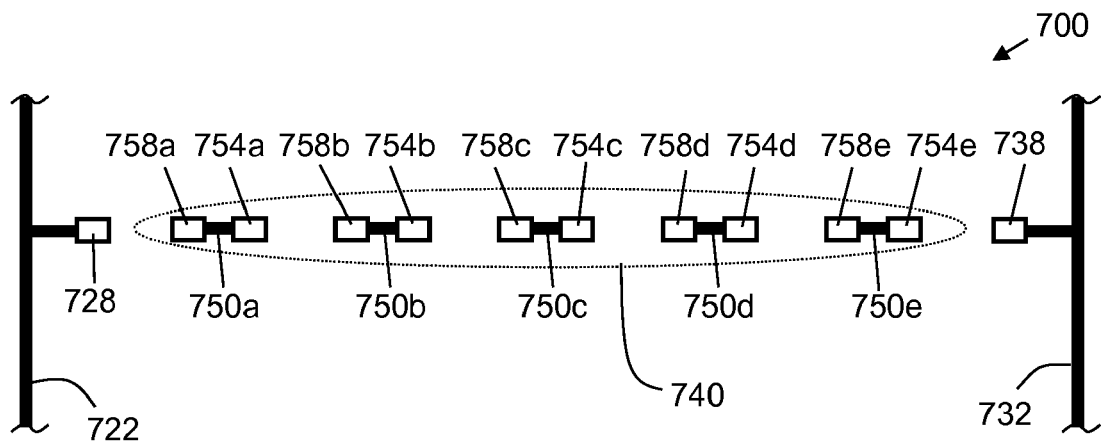
FIG. 7 is a top view of a photovoltaic roofing wiring array including five wiring elements in a series wiring runs, according to one embodiment of the present invention

In certain embodiments of the invention, the photovoltaic roofing wiring array further includes one or more series wiring runs. For example, in FIGS. 5, 6 and 7 photovoltaic roofing wiring arrays 500, 600 and 700 include not only parallel wiring runs 522 and 532, 622 and 632 and 722 and 732, but also one or more series wiring runs 540, 640 and 740. Each series wiring run includes a sequence of one or more wiring elements 550, 650 and 750a-e each of which has a positive end terminated in a positive connector 554, 654 and 754a-e and a negative end terminated in a negative connector 558, 658 and 758a-e. As with the parallel wiring runs, the positive connectors of the series wiring runs are coupleable with the positive connectors of the photovoltaic elements. Similarly, the negative connectors of the series wiring runs are coupleable with the negative connectors of the photovoltaic elements. The series wiring runs 540, 640 and 740 include a sequence of wiring elements disposed sequentially in a substantially head-to-tail fashion from a positive connector 528, 628 and 728 of the positive parallel wiring run 522, 622 and 722 to a negative connector 538, 638 and 738 of the negative parallel wiring run. As shown in series wiring run 740 of FIG. 7, the negative connector 758a of the first wiring element 750 in the sequence is disposed within one lead-to-lead distance of the positive connector 728 of the positive parallel wiring run, so that a photovoltaic element can be connected therebetween. Similarly, the positive connector 754e of the last wiring element 750e in the sequence is disposed within one lead-to-lead distance of the negative connector of the negative parallel wiring run. For the other wiring elements in the sequence, the positive connector is within one lead-to-lead distance of the negative connector of the subsequent wiring element, and the negative connector is within one lead-to-lead distance of the positive connector of the previous wiring element. For example, in the embodiment of FIG. 7, the positive connector 754c of wiring element 750c is within one lead-to-lead distance of the negative connector 758d of wiring element 750d, and the negative connector 758c of wiring element 750c is within one lead-to-lead distance of the positive connector 754b of wiring element 750b.

In certain embodiments of the invention, a series wiring run will have only a single wiring element in its sequence of wiring elements. For example, in the embodiment of FIG. 5, series wiring run 540 consists of a sequence of one series wiring element 550. Wiring element 550 is therefore both the first wiring element and the last wiring element in the sequence running from the positive connector 528 of the positive parallel wiring run to the negative connector 538 of the negative parallel wiring run. Accordingly, the negative connector 558 of wiring element 550 is disposed within one lead-to-lead distance of positive connector 528, and the positive connector 554 of wiring element 550 is disposed within one lead-to-lead distance of negative connector 538.

In other embodiments of the invention, a series wiring run will comprise a first end wiring element, a second end wiring element, and a sequence of one or more interior wiring elements. For example, in the embodiment shown in FIG. 7, series wiring run 740 includes a first end wiring element 750a having a positive end terminated in a positive connector 754a, and a negative end terminated in a negative connector 758a disposed within one lead-to-lead distance of positive connector 728 of the positive parallel wiring run 722. Series wiring run 740 also includes a second end wiring element 750e having a positive end terminated in a positive connector 754e disposed within one lead-to-lead distance of negative connector 738 of the negative parallel wiring run 732, and a negative end terminated in a negative connector 758e. Series wiring run 740 further includes a sequence of three interior wiring elements 750b, 750c and 750d, each having a positive end terminated in a positive connector (754b, 754c, 754d) and a negative end terminated in a negative connector (758b, 758c, 758d). The three interior wiring elements are disposed sequentially in a substantially head-to-tail fashion from the first end wiring element to the second end wiring element, with each positive connector being within one lead-to-lead distance of the negative connector of the subsequent wiring element in the sequence, and each negative connector being within one lead-to-lead distance of the negative connector of the previous wiring element in the sequence. While the embodiments shown in the figures have only up to five wiring elements in their series wiring runs, the skilled artisan will realize that in practice it can be desirable to connect tens or even hundreds of photovoltaic elements in series. Accordingly, in one embodiment of the invention, each series wiring run includes at least ten, at least fifty, or at least one hundred wiring elements in each series wiring run.

Figure 8:
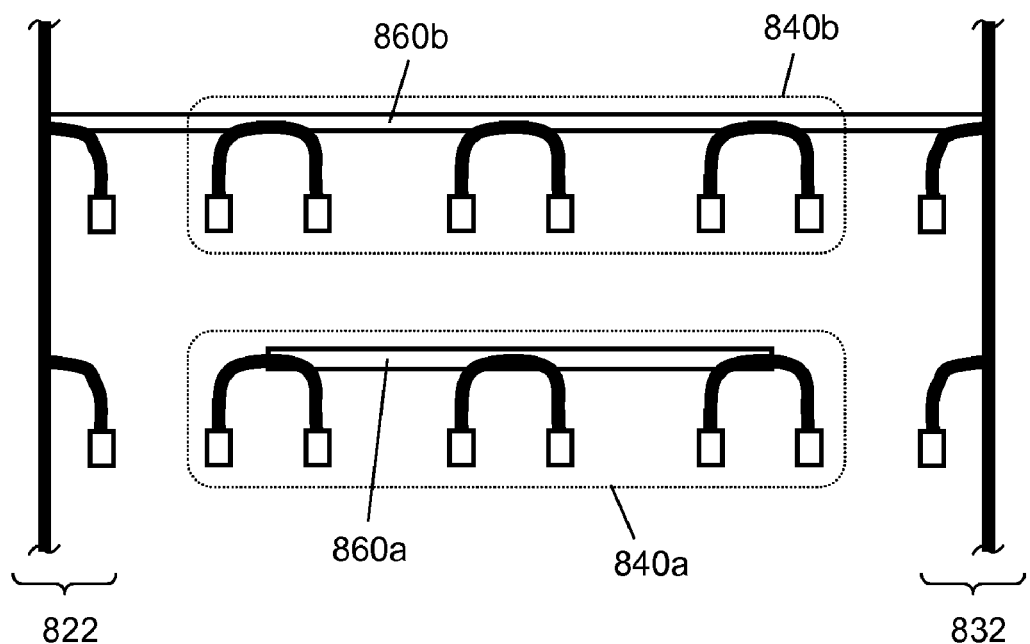
FIG. 8 is a top view of a photovoltaic roofing wiring array in which the wiring elements of a series wiring run are physically interconnected, according to one embodiment of the present invention.

It can be desirable to physically (but not electrically) interconnect individual wiring elements of a series wiring run. A physical interconnection can help retain the individual wiring elements in a desired spatial relationship, as well as simplify installation. For example, in the embodiment shown in FIG. 8, each individual wiring element of series wiring run 840a is affixed to a continuous guiding element 860a. The guiding element can be made, for example, out of plastic, wire, rope, metal, wood (e.g. lath or strip). Each wiring element can be affixed to the continuous guiding element at one point, at two or more points, or along a length of the wiring element, with glue, wire, plastic wiring ties, string, tape, or any other convenient affixing method.

In certain embodiments of the invention, the physical interconnection continues to connect the wiring elements of the series wiring runs with the positive parallel wiring run and the negative parallel wiring run. For example, in series wiring run 840b of FIG. 8, the continuous guiding element 860b physically interconnects the wiring elements of the series wiring run 840b with the parallel wiring runs 822 and 832. In such embodiments of the invention, a photovoltaic wiring array for a section of roof can be provided as a single physically interconnected unit. In one embodiment of the invention, the continuous guiding element is part of an electrical grounding system, especially suitable for use with photovoltaic elements and photovoltaic roofing elements that require electrical grounding.

In another embodiment of the invention, the physical interconnections described above include bypass diodes electrically interconnecting the individual wiring elements with one another and with the parallel wiring runs. The bypass diodes would provide alternative electrical paths if the any of the attached photovoltaic elements develop a fault or malfunction. Such a wiring array would be especially desirable for use with photovoltaic elements and photovoltaic roofing elements which do not themselves include a bypass diode.

Figure 9:
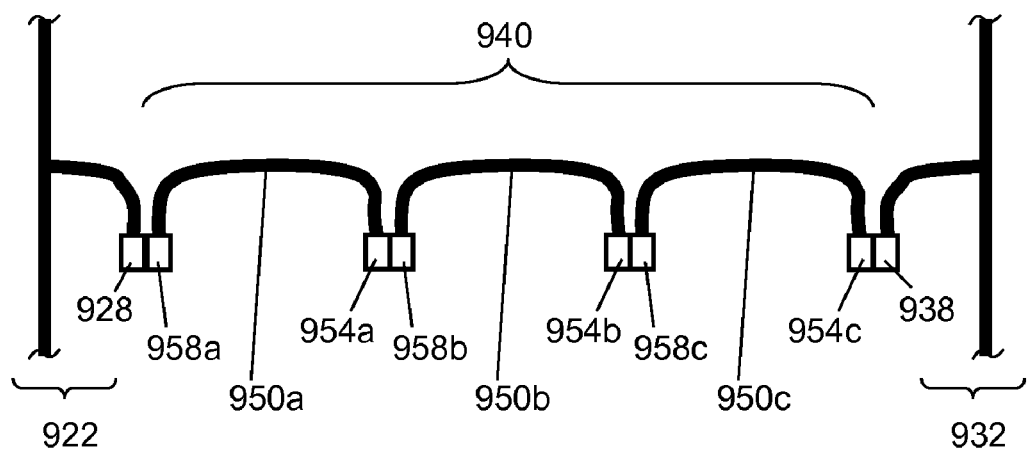
FIG. 9 is a top view of a photovoltaic roofing wiring array in which each positive connector is affixed to its corresponding negative connector.

In certain embodiments of the invention, a positive connector and a corresponding negative connector (i.e., within the lead-to-lead distance of one another) can be affixed (though electrically isolated) to one another. For example, the positive connector of at least one connection branch of a positive parallel wiring run might be affixed to the negative connector of a first end wiring element of its corresponding series wiring run. Similarly, the negative connector of at least one connection branch of a negative parallel wiring run might be affixed to the positive connector of a second end wiring element of its corresponding series wiring run. In certain embodiments of the invention, in one or more series wiring runs, the negative connector of at least one wiring element is affixed to its corresponding positive connector; and the positive connector of at least one wiring element is affixed to its corresponding negative connector. For example, in the embodiment shown in FIG. 9, series wiring run 940 includes a first end wiring element 950a having a negative end terminated in a negative connector 958a, which is affixed to the positive connector 928 of positive parallel wiring run 922, and a positive end terminated in a positive connector 954a. Series wiring run 940 also includes a single interior wiring element 950b, having a negative end terminated in a negative connector 958b, which is affixed to the positive connector 954a of first end wiring element 950a, and a positive end terminated in a positive connector 954b. Series wiring run 940 also includes a second end wiring element 950c, having a negative end terminated in a negative connector 958c, which is affixed to the positive connector 954b of interior wiring element 950b, and a positive end terminated in a positive connector 954c affixed to the negative connector 938 of negative parallel wiring run 932. In certain embodiments of the invention, a bypass diode electrically connects the physically connected negative connector and positive connector, so as to provide an alternative electrical path if the attached photovoltaic element develops a fault or malfunction.

Affixed connectors can provide a number of advantages. For example, affixing connectors can provide physical interconnection, which is desirable from the standpoint of maintaining spatial relationships and simplifying installation. As the skilled artisan will recognize, not all connectors along a series wiring run need to be affixed to one another. A long series wiring run might consist of a few sets of wiring elements with affixed connectors, with a few unaffixed wiring elements disposed between them or at the ends of the wiring runs. Similarly, the connectors of the parallel wiring runs need not be affixed to any connectors of the series wiring runs. In this way, series wiring runs of different lengths can be made from only a few standardized parts (e.g., a single wiring element, a run of three wiring elements with affixed internal connectors, a run of ten wiring elements with affixed internal connectors, and a run of thirty wiring elements with affixed internal connectors).

As the skilled artisan will recognize, an affixed pair of connectors can be formed by gluing or tying two individual connectors together. Alternatively, a positive connector and a negative connector can be formed in a unitary piece, adapted to connectorize two conductors (e.g., the positive end of one wiring element and the negative end of an adjacent wiring element). Such unitary connectors can be especially desirable for use with embodiments of the invention in which the photovoltaic roofing elements have similarly unitary connectors because the connection of each photovoltaic element to the photovoltaic roofing wiring array would require the coupling of only one pair of connectors.

When the series wiring elements are physically interconnected (and especially when they are physically connected with the parallel wiring runs), the photovoltaic wiring arrays of the present invention can be provided as substantially prefabricated systems. In such systems, the installer need not individually arrange all the individual components on the roof, but rather need merely lay out the substantially prefabricated systems.

Figure 10:
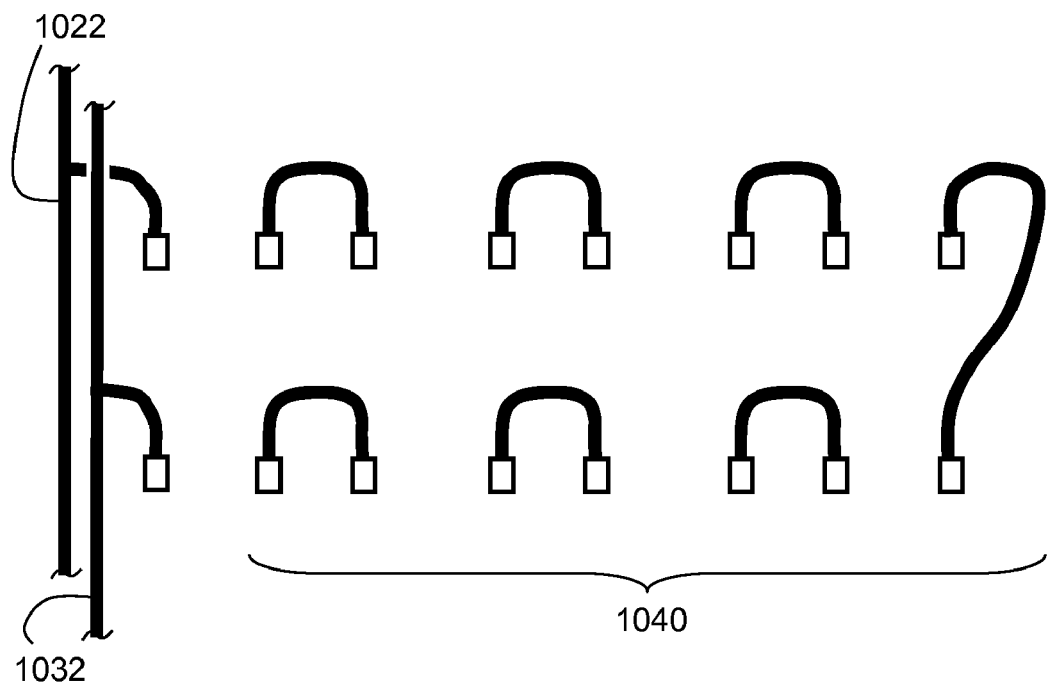
FIG. 10 is a top view of a photovoltaic roofing wiring array in which the main lines of the parallel wiring runs run along a common path, and the series wiring run extends physically away from the parallel wiring runs and loops back, according to one embodiment of the invention.

In the embodiments of the invention discussed with reference to FIGS. 5-9, the parallel wiring runs are spaced apart, with the series wiring runs physically disposed between them. However, in some embodiments of the invention it can be desirable for the parallel wiring runs to physically run along a common path. For example, in the embodiment shown in FIG. 10, positive parallel wiring run 1022 and negative parallel wiring run 1032 run right next to each other, with series wiring run 1040 extending physically away from them then looping back. In the embodiment shown in FIG. 10, each of the series wiring runs can provide electrical connection for two courses of photovoltaic elements. Of course, as the skilled artisan will appreciate, the series wiring runs can be disposed in a switchback fashion in order to interconnect more courses of photovoltaic elements. As described above, the parallel wiring runs can be physically connected to one another. As will be clear to those of ordinary skill in the art, the series wiring runs can be physically disposed in any of a number configurations with respect to the parallel wiring runs but are electrically disposed between them (i.e., together with the photovoltaic roofing elements forming an electrical circuit with the parallel wiring runs).

Figure 11:
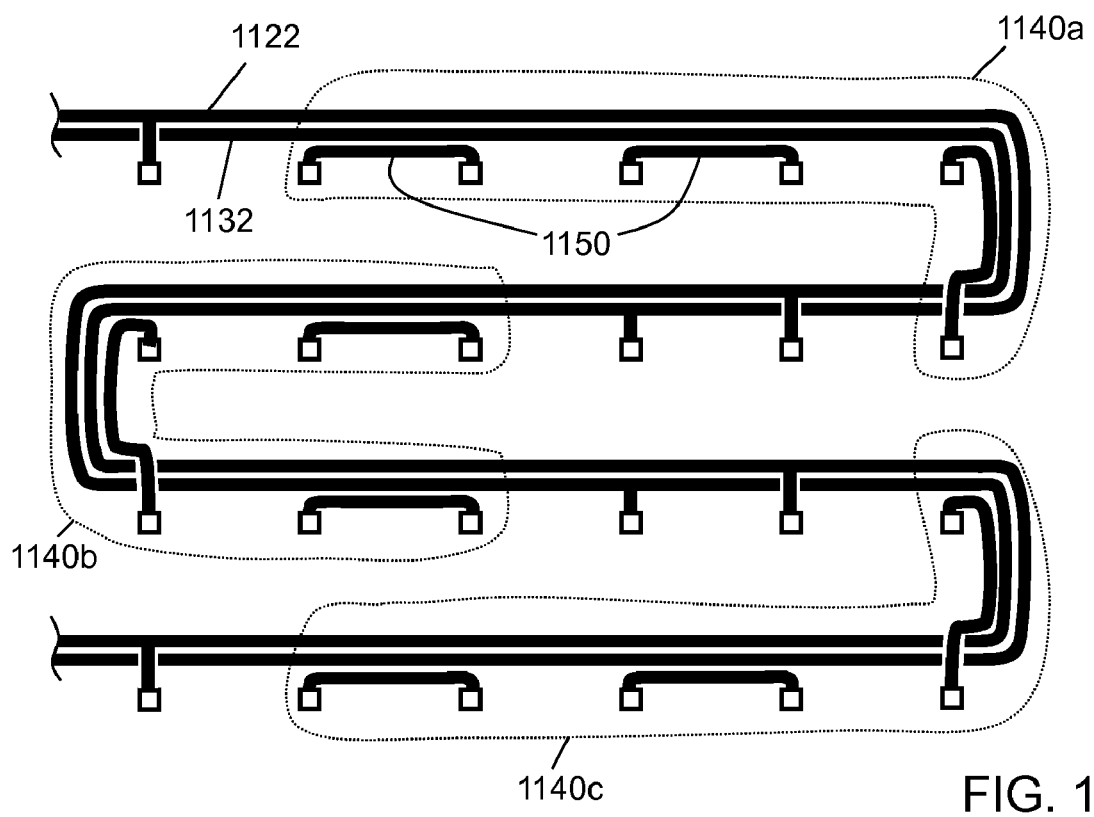
FIG. 11 is a top view of a photovoltaic roofing wiring array in which the parallel wiring runs and the one or more series wiring runs all run substantially along the same path, according to one embodiment of the invention.

In another embodiment of the invention, the positive parallel wiring run, the negative parallel wiring run and the one or more series wiring runs are all disposed substantially along the same path. For example, in certain embodiments of the invention the parallel wiring runs and the one or more series wiring runs are all affixed to one another. For example, in the embodiment shown in FIG. 11, the parallel wiring runs and three series wiring runs are formed together as a single bundle of cables. Positive parallel wiring run 1122 and negative parallel wiring run 1132 are disposed in a switchback fashion. Series wiring runs 1140a, 1140b and 1140c run substantially along the same path as the parallel wiring runs 1122 and 1132. Each wiring element 1150 is bundled together with the parallel wiring runs 1122 and 1132, with their connectorized ends extending slightly away from the bundle. In the embodiment shown in FIG. 11, each positive connector is separate from its corresponding negative connector; the skilled artisan will appreciate that any desirable connectorization can be used, including those in which the positive connectors are affixed to their corresponding negative connectors. In certain embodiments of the invention, the parallel wiring runs and series wiring runs are built together in a single cable structure, with the connectors protruding from the cable. Embodiments of the invention analogous to those shown in FIG. 11 can be especially useful when the length of each series wiring runs is not a multiple (in units of photovoltaic roofing elements) of the length of a course of photovoltaic elements. For example, in the embodiment of FIG. 11, each course of photovoltaic elements would include three such elements; but each series wiring run can interconnect four photovoltaic elements into the photovoltaic roofing wiring system.

The skilled artisan will appreciate that the photovoltaic roofing wiring arrays of the present invention can be assembled in a wide variety of configurations from a stock of premade standard parts. Accordingly, the present invention provides flexibility to the skilled artisan in accommodating any roof size or shape, and any size or shape of photovoltaic elements.

The wire and connector components used in the present invention can be selected by the skilled artisan based on such factors as power handling ability, cost and form factor. The series wiring runs can build up potential differences of several hundred Volts apiece, and the overall system can generate, for example, 2-10 Amperes at a potential difference of several hundred Volts. As the skilled artisan will recognize, in many situations it is desirable to run a photovoltaic power generation system at relatively higher voltages and relatively lower currents, in order to minimize the thickness of wires and cables needed to safely transmit the generated power. Accordingly, the wire and connector components should be rated to withstand such conditions, and are desirably UL and NEC approved for exterior use. The connectors are desirably quick-disconnect connectors. The positive connectors can be of a different type entirely than the negative connectors, or can be of similar types. However, when the positive and negative connectors are of similar types, they are desirably selected so that it is impossible to couple a negative connector of a photovoltaic element with a positive connector of the photovoltaic wiring array, and a positive connector of a photovoltaic element with a negative connector of the photovoltaic wiring array. In certain embodiments of the invention, the negative connectors of the photovoltaic wiring array are selected to be coupleable with the positive connectors of the photovoltaic wiring array; in such embodiments, a connector of a series wiring run can be coupled to its corresponding connector in order to omit a photovoltaic element that would normally be connected therebetween. For example, the negative connectors of the photovoltaic wiring array and the positive connectors of the photovoltaic elements could be male connectors; and the positive connectors of the photovoltaic wiring array and the negative connectors of the photovoltaic elements could be female connectors. The wires, cables and connectors are desirably made from weather resistant materials, and desirably form water-tight connections with one another. Examples of suitable cable and connectors systems include the SOLARLOK Interconnection System available from Tyco Electronics, and the photovoltaic connectors and cables available from Multi-Contact USA.

Another aspect of the present invention provides a roof comprising a roof deck and a photovoltaic roofing wiring array as described above disposed on the roof deck. There can be one or more layers of material between the roof deck and the photovoltaic roofing wiring array. For example, the photovoltaic roofing wiring array can be installed on top of an existing roof; in such embodiments, there would be one or more layers of roofing elements (e.g., asphalt coated shingles) between the roof deck and the photovoltaic wiring array.

Another aspect of the present invention comprises a photovoltaic roofing wiring system including a photovoltaic roofing wiring array as described above disposed on or within a wiring substrate. The wiring substrate can be, for example, a sheet of underlay material; an underlay platform, optionally with channels formed in it to receive the photovoltaic roofing wiring system; or a rigid frame, optionally with channels formed in it to receive the photovoltaic roofing wiring system. Wiring substrates for use in the present invention can be flexible, semi-rigid, or rigid, and can be provided as a series of panels or strips of material to be assembled on the roof by the installer. In one embodiment of the invention, the wiring substrate is a rolled roofing material, such as a membrane material or a coated paper material or a non-woven web material.

In one embodiment of the invention, the wiring substrate is formed from one or more sheets of roofing underlay material. The roofing underlay material can be formed from, for example, a polymeric material, a non-woven fabric such as a roofing felt, a roofing membrane, a scrim material or a coated paper. As the skilled artisan will recognize, the underlay material can be conveniently supplied in roll form. The skilled artisan will recognize that many different types of underlay materials can be used in the present invention, including those that may help retard the spread of fire. The wiring array can be affixed to the underlay material (and optionally to a roof deck on which the photovoltaic roofing wiring system is installed) using any desirable fasteners. For example, the photovoltaic roofing wiring array can be affixed to the underlay material by wiring holders (e.g., brackets, staples, nails, screws) affixed through the underlay material and into the roof deck. Alternatively, the photovoltaic roofing wiring array can be affixed to the underlay material by adhesive tape or an adhesive material. In many embodiments of the invention, the photovoltaic elements themselves will provide additional structural stability to the photovoltaic roofing wiring array. In these embodiments, the photovoltaic roofing system wiring array need not be permanently affixed to the underlay material, so adhesive tape can be used to temporarily affix the photovoltaic roofing wiring array to the underlay material until the photovoltaic roofing elements are installed.

In another embodiment of the invention, the wiring substrate is an underlay platform. The underlay platform can be formed from any desirable material, for example a polymeric material, fiber cement, fiberglass, chipboard or wood, and can be flexible, semi-rigid, or rigid. The underlay platform can be made from a single sheet of material, or rather can be assembled from a plurality of panels. In one embodiment of the invention, for example, the underlay platform is made from a plurality of structural insulated panels. The underlay platform can have channels formed in it, with the photovoltaic roofing wiring array being disposed within the channels. The channels would provide guidance to an installer in arranging the photovoltaic roofing wiring array, so that he or she need not have intimate knowledge of the electrical system. The channels can also help provide a relatively flat surface for the subsequent installation of the photovoltaic roofing elements; if the photovoltaic roofing wiring array does not protrude substantially past the face of the underlay board, then the photovoltaic roofing elements can be installed without the need for the photovoltaic roofing elements themselves to provide a recess for the elements of the photovoltaic roofing wiring array. The underlay platform can also have a void space within it or on its underside to provide insulation, cooling and/or fireproofing, for example as described in U.S. Pat. Nos. 5,338,369, 6,061,978 and 6,800,801, each of which is hereby incorporated herein by reference. The underlay platform can be provided with hooks, clips, slots, nailholes, or other structures to be used in the subsequent attachment of photovoltaic roofing elements, for example as described in U.S. Pat. Nos. 6,521,821, 6,245,987 and 6,155,006, each of which is hereby incorporated herein by reference. In certain embodiments of the invention, the underlay platform is of sufficient thickness and strength to be load bearing, so that no separate roof deck is required. In such embodiments of the invention, the underlay platform can be attached directly to a roof frame, so that it also performs the function of a roof deck or roof cladding. In another embodiment of the invention, the underlay platform forms a waterproof layer, thereby performing the function of conventional underlayment. The underlay platform can be affixed to the roof using any desirable method. For example, the underlay platform can be mechanically attached to the roof, or adhered using an adhesive material.

Figure 13:
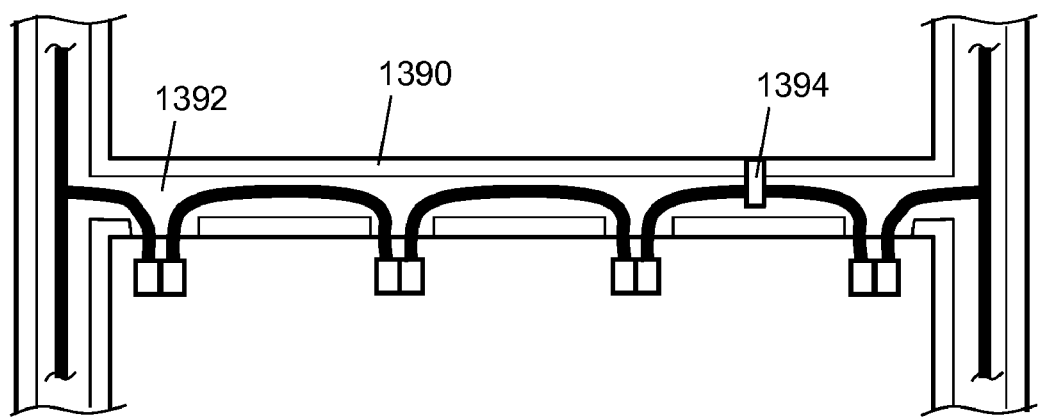
FIG. 13 is a partial schematic top view of a frame structure for use in one embodiment of the invention.

In another embodiment of the invention, the wiring substrate is a rigid frame. The rigid frame can be formed, for example, from plastic, wood or metal (e.g., in the form of lath, strips or battens), and can be, for example, prefabricated or assembled on the roof from rail-like parts. The frame can be formed, for example, as a physically-interconnected grid, or as a series of linear structures physically affixed separately to the roof deck. In one embodiment of the invention, the rigid frame has channels formed in it, and the photovoltaic roofing wiring array is disposed within the channels. In another embodiment, the rigid frame has a plurality of wiring clips, and the photovoltaic roofing wiring array is held by the clips. Of course, the skilled artisan will appreciate that other methods, such as plastic wire ties, can be used to physically interconnect the photovoltaic roofing wiring array with the rigid frame. A schematic top view of a frame 1390, with a channel 1392 and a clip 1394, is provided as FIG. 13. The frame can also have features (e.g. clips, holes, ridges) for the attachment of tiles. Examples of frames that can be adapted for use in the present invention are described in, for example, U.S. Pat. Nos. 4,936,063; 5,125,983 and 6,065,255 and U.S. Patent Application Publication no. 2004/0000334, each of which is hereby incorporated herein by reference.

Figure 12:
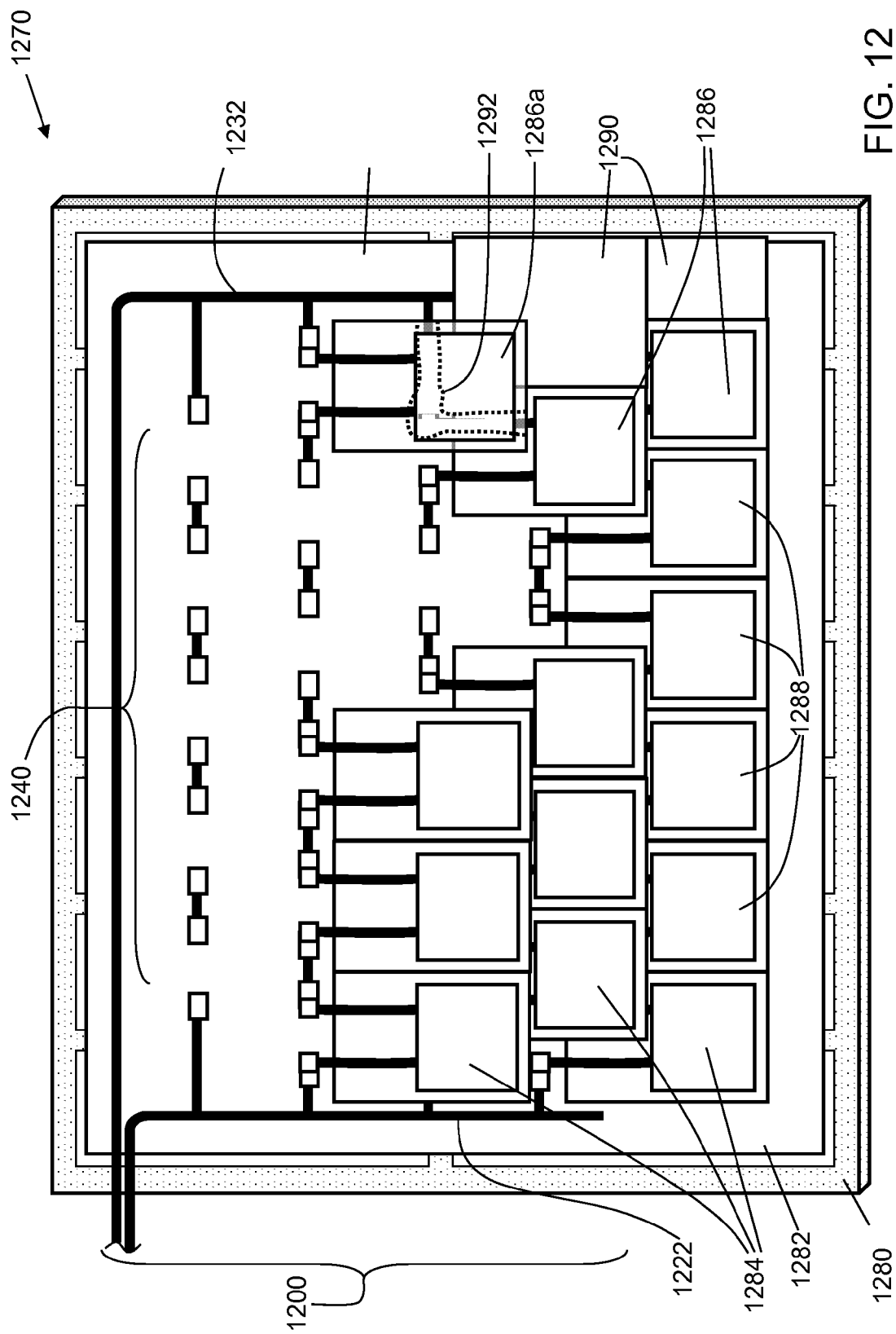
FIG. 12 is a partial top perspective view of a roof according to another embodiment of the invention.

In some embodiments of the invention, the wiring substrate is marked (e.g., by printing) with indicia for the placement and/or connection of a photovoltaic roofing wiring array, shown, for example, by reference number 1289 in FIG. 12. The installer can use the indicia in arranging the photovoltaic roofing wiring array on the roof and/or connecting it with photovoltaic elements, thereby simplifying installation. For example, the installer can arrange the photovoltaic roofing wiring array so that it is disposed substantially in accordance (i.e., matches up with) the indicia. In these embodiments of the invention, the installer need not have intimate knowledge of the electrical system, but rather need only follow the guidelines provided by the wiring substrate. Similarly, in some embodiments of the invention, the wiring substrate is marked (e.g., by printing) with indicia for the placement of photovoltaic elements or photovoltaic roofing elements, shown, for example, by reference number 1287 in FIG. 12. Such markings can obviate the need for roofing installers to snap chalk lines or otherwise mark the surface with guidelines for placement of roofing elements (i.e., photovoltaic roofing elements or standard roofing elements such as shingles or tiles). In certain embodiments of the invention, the wiring substrate is marked with both of the above-described types of indicia. As the skilled artisan will appreciate, when the wiring substrate is built from a plurality of individual elements (e.g., a plurality of panels), it will be necessary for the elements to be properly aligned to one another so that the indicia are properly registered between the individual elements.

Another aspect of the invention provides a roof. One embodiment according to this aspect of the invention is shown in partial top view in FIG. 12. A roof 1270 includes a roof frame 1280, and a wiring substrate 1282 disposed on the roof frame. In the embodiment shown in FIG. 12, the wiring substrate is an underlay platform having sufficient strength and rigidity that it can perform the function of a roof deck, and therefore is disposed directly on the roof frame. The skilled artisan will appreciate that any desirable wiring substrate can be used in the roofs according to this aspect of the invention, and that the roof may include a roof deck between the roof frame and the wiring substrate. A wiring array 1200 is disposed on the wiring substrate 1282. As the skilled artisan will appreciate, in certain embodiments according to this aspect of the invention the wiring array is instead disposed within the wiring substrate (e.g., within channels formed in a rigid frame in underlay board; or running underneath wiring substrate with the connectors running through to the top side of the wiring substrate). As described above, wiring array 1200 includes a positive parallel wiring run 1222 and a negative parallel wiring run 1232, each of which includes a main line and one or more connection branches pendant from the main line. The connection branches of the positive parallel wiring runs are terminated in positive connectors, and the connection branches of the negative parallel wiring runs are terminated in negative connectors. Likewise, wiring array 1200 also includes one or more series wiring runs 1240, each comprising a first end wiring element having a first end wiring element having a positive end terminated in a positive connector and a negative end terminated in a negative connector; a second end wiring element having a positive end terminated in a positive connector and a negative end terminated in a negative connector; and a sequence of interior wiring elements, each having a positive end terminated in a positive connector and a negative end terminated in a negative connector, arranged in a substantially head-to-tail manner from the first end wiring element to the second end wiring element. The roof 1270 also includes one or more first end photovoltaic roofing elements 1284, each of which includes a photovoltaic element disposed on or within a roofing substrate. The photovoltaic element of each first end photovoltaic roofing element includes a positive lead terminated in a positive connector, and a negative lead terminated in a negative connector. The positive connector is coupled to a positive connector of a connection branch of the positive parallel wiring run, and the negative connector is coupled to the negative connector of the corresponding series wiring element. The roof 1270 further includes one or more second end photovoltaic roofing elements 1286, each of which includes a photovoltaic element disposed on or within a roofing substrate. The photovoltaic element of each second end photovoltaic roofing element includes a negative lead terminated in a negative connector, and a positive lead terminated in a positive connector. The negative connector is coupled to a negative connector of a connection branch of the negative parallel wiring run, and the positive connector is coupled to the positive connector of the corresponding series wiring element. Finally, in certain embodiments of the invention, the roof 1270 of FIG. 12 further includes one or more interior photovoltaic roofing elements 1288, each of which includes a photovoltaic element disposed on or within a roofing substrate. In certain embodiments of the invention, the photovoltaic roofing elements have void space on their back side to accept any protruding parts of the photovoltaic wiring system and photovoltaic elements it sits upon. For example, second end photovoltaic roofing element 1286a has a channel 1292 formed in its underside to accept the lead, connectors, and connection branch it sits upon. As the skilled artisan would recognize, different courses of photovoltaic roofing elements could overlap one another to provide added weather protection as shown in FIG. 12. Moreover, the roof may also include one or more standard (i.e., non-photovoltaic) roofing elements 1290, for example to provide weather protection at the edges of the roof, or in any hips, valleys, and ridges of the roof.

It will be apparent to those skilled in the art that various modifications and variations can be made to the present invention without departing from the scope of the invention. Thus, it is intended that the present invention cover the modifications and variations of this invention provided they come within the scope of the appended claims and their equivalents.

What is claimed is:

1. A photovoltaic roofing wiring array for use with a plurality of photovoltaic roofing elements, each photovoltaic roofing element having a positive lead terminated in a positive connector and a negative lead terminated in a negative connector, and a lead-to-lead distance between the positive connector and the negative connector, the photovoltaic roofing wiring array comprising:
   a positive parallel wiring run, the positive parallel wiring run comprising a main line and one or more connection branches pendant from the main line, each connection branch being terminated in a positive connector;
   a negative parallel wiring run, the negative parallel wiring run comprising a main line and one or more connection branches pendant from the main line, each connection branch being terminated in a negative connector; and
   a plurality of series wiring runs, each series wiring run comprising a sequence of a plurality of wiring elements including a first wiring element and a last wiring element and optionally one or more interior wiring elements, each wiring element having a positive end terminated in a positive connector coupleable to the positive connector of the photovoltaic roofing elements, and a negative end terminated in a negative connector coupleable to the negative connector of the photovoltaic roofing elements, the series wiring elements being disposed sequentially in a substantially head-to-tail fashion from a positive connector of the positive parallel wiring run to a negative connector of the negative parallel wiring run, wherein
      the negative connector of the first wiring element in the sequence is disposed within one lead-to-lead distance of the positive connector of the positive parallel wiring run;
      the positive connector of the last wiring element in the sequence is disposed within one lead-to-lead distance of the negative connector of the negative parallel wiring run; and
      for any optional interior wiring elements in the sequence, the positive connector is within one lead-to-lead distance of the negative connector of the subsequent wiring element; and the negative connector is within one lead-to-lead distance of the positive connector of the previous wiring element,
   wherein each positive connector is coupleable to the positive connectors of the photovoltaic roofing elements; and
   each negative connector is coupleable to the negative connectors of the photovoltaic roofing elements,
   but wherein the positive parallel wiring run, the negative parallel wiring run, and the one or more series wiring runs are not coupled to any photovoltaic roofing elements; and
   wherein the positive parallel wiring run, the negative parallel wiring run, and the wiring elements of the series wiring run are physically interconnected such that the wiring array is provided as a single physically interconnected unit, in which
      adjacent wiring elements of each series wiring run are physically affixed, but not electrically interconnected, to one another,
      the first wiring element of the series wiring run is physically affixed, but not electrically interconnected, to the positive parallel wiring run, and
      the last wiring element of the series wiring run is physically affixed, but not electrically interconnected, to the negative parallel wiring run.

2. The photovoltaic roofing wiring array of claim 1, wherein the positive connectors and negative connectors are quick-disconnect connectors.

3. The photovoltaic roofing wiring array of claim 1, wherein the each series wiring run includes the one or more interior wiring elements.

4. The photovoltaic roofing wiring array of claim 1, wherein the adjacent wiring elements of each series wiring run are physically, but not electrically, connected to one another through their wirings.

5. The photovoltaic roofing wiring array of claim 4, wherein the first wiring element of each series wiring run is physically affixed, but not electrically interconnected, to the positive parallel wiring run through its wiring, and the last wiring element of each series wiring run is physically affixed, but not electrically interconnected, to the negative parallel wiring run through its wiring.

6. The photovoltaic roofing wiring array of claim 1, wherein the one or more series wiring runs, the positive parallel wiring run and the negative parallel wiring run are all disposed substantially along the same path.

7. The photovoltaic roofing wiring array of claim 1, wherein for each series wiring run,
   the negative connector of the first wiring element of the series wiring run is physically affixed, but not electrically interconnected, to one of the positive connectors of the positive parallel wiring run,
   the positive connector of the last wiring element of the series wiring run is physically affixed, but not electrically interconnected, to one of the negative connectors of the negative parallel wiring run, and
   for each wiring element but the last wiring element of the series wiring run, the positive connector is physically affixed, but not electrically interconnected, to the negative connector of the next adjacent wiring element of the series wiring run.

8. The photovoltaic roofing wiring array of claim 7, wherein each pair of affixed connectors is formed in a unitary piece.

9. A roof comprising the photovoltaic roofing wiring array of claim 1 disposed on a roof deck.

10. A photovoltaic roofing wiring system comprising a wiring substrate; and
   a wiring array according to claim 1 disposed on or within the wiring substrate.

11. The photovoltaic roofing wiring system of claim 10, wherein the wiring substrate is a rigid frame.

12. The photovoltaic roofing wiring system of claim 10, wherein the wiring substrate is an underlay platform.

13. The photovoltaic roofing wiring system of claim 10, wherein the wiring substrate is marked with indicia for placement of roofing elements.

14. A roof comprising the photovoltaic roofing wiring system of claim 10 affixed to a roof deck.

15. The photovoltaic roofing wiring array of claim 1, wherein the main line of the positive parallel wiring run has a plurality of the connection branches pendant therefrom; and the main line of the negative parallel wiring run has a plurality of the connection branches pendant therefrom.

16. A photovoltaic roofing wiring system for use with a plurality of photovoltaic roofing elements, each photovoltaic roofing element having a positive lead terminated in a positive connector and a negative lead terminated in a negative connector, and a lead-to-lead distance between the positive connector and the negative connector, the photovoltaic roofing wiring system comprising:

an underlay platform having one or more channels formed in its top surface; and a photovoltaic roofing wiring array disposed in the one or more channels, the photovoltaic roofing wiring array comprising:

a positive parallel wiring run, the positive parallel wiring run comprising a main line and one or more connection branches pendant from the main line, each connection branch being terminated in a positive connector;

a negative parallel wiring run, the negative parallel wiring run comprising a main line and one or more connection branches pendant from the main line, each connection branch being terminated in a negative connector; and a plurality of series wiring runs, each series wiring run comprising a sequence of a plurality of wiring elements including a first wiring element and a last wiring element and optionally one or more interior wiring elements, each wiring element having a positive end terminated in a positive connector coupleable to the positive connector of the photovoltaic roofing elements, and a negative end terminated in a negative connector coupleable to the negative connector of the photovoltaic roofing elements, the series wiring elements being disposed sequentially in a substantially head-to-tail fashion from a positive connector of the positive parallel wiring run to a negative connector of the negative parallel wiring run, wherein the negative connector of the first wiring element in the sequence is disposed within one lead-to-lead distance of the positive connector of the positive parallel wiring run;

the positive connector of the last wiring element in the sequence is disposed within one lead-to-lead distance of the negative connector of the negative parallel wiring run; and for any optional interior wiring elements in the sequence, the positive connector is within one lead-to-lead distance of the negative connector of the subsequent wiring element; and the negative connector is within one lead-to-lead distance of the positive connector of the previous wiring element, wherein each positive connector is coupleable to the positive connectors of the photovoltaic roofing elements; and each negative connector is coupleable to the negative connectors of the photovoltaic roofing elements, but wherein the positive parallel wiring run, the negative parallel wiring run, and the one or more series wiring runs are not coupled to any photovoltaic elements; and wherein the first wiring element of the series wiring run is physically affixed, but not electrically interconnected, to the positive parallel wiring run, and the last wiring element of the series wiring run is physically affixed, but not electrically interconnected, to the negative parallel wiring run.

17. The photovoltaic roofing wiring system of claim 16, wherein the underlay platform has a void space in its interior or on its underside.

18. The photovoltaic roofing wiring system of claim 16, wherein the underlay platform is of sufficient thickness and strength to be load bearing, and is not disposed on a separate roof deck.

19. The photovoltaic roofing wiring system of claim 16, wherein the underlay platform is attached directly to a roof frame.

20. The photovoltaic roofing wiring array according to claim 1, not disposed on a roof.

\* \* \* \* \*